United States Patent
Ma et al.

(10) Patent No.: US 10,788,913 B2
(45) Date of Patent: Sep. 29, 2020

(54) ARRAY SUBSTRATE AND MANUFACTURING METHOD THEREOF, TOUCH DISPLAY PANEL, TOUCH DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Mingchao Ma, Beijing (CN); Jun Fan, Beijing (CN); Fuqiang Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 8 days.

(21) Appl. No.: 16/225,320

(22) Filed: Dec. 19, 2018

(65) Prior Publication Data
US 2019/0212853 A1  Jul. 11, 2019

(30) Foreign Application Priority Data
Jan. 11, 2018  (CN) .......................... 2018 1 0027586

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/047* (2013.01); *G06F 3/0443* (2019.05);
(Continued)

(58) Field of Classification Search
CPC .......... G06F 3/045; G06F 3/044; G06F 3/041; G06F 3/04; G01R 27/26
See application file for complete search history.

(56) References Cited

U.S. PATENT DOCUMENTS

2004/0207321 A1* 10/2004 Nishikawa ............ H01L 27/322
 313/506
2011/0031493 A1*  2/2011 Yamazaki ........... H01L 27/1251
 257/43
(Continued)

FOREIGN PATENT DOCUMENTS

CN  102967971 A  3/2013
CN  103677427 A  3/2014
(Continued)

OTHER PUBLICATIONS

First Office Action issued in corresponding Chinese Application No. 201810027586.9, dated Jul. 30, 2020, with English language translation.

*Primary Examiner* — Pegeman Karimi
(74) *Attorney, Agent, or Firm* — McDermott Will & Emery LLP

(57) ABSTRACT

An array substrate includes: thin film transistors disposed on a base substrate; pixel electrodes disposed on a side of the thin film transistors facing away from the base substrate, each pixel electrode being coupled with a drain of a corresponding thin film transistor; common electrodes disposed on a side of the pixel electrodes facing away from the thin film transistors; and touch electrodes disposed on a side of the common electrodes facing away from the pixel electrodes, each touch electrode being coupled with a corresponding common electrode.

16 Claims, 3 Drawing Sheets

(51) Int. Cl.
*H01L 27/12* (2006.01)
*G06F 3/047* (2006.01)

(52) U.S. Cl.
CPC ........ *G06F 3/04164* (2019.05); *H01L 27/124* (2013.01); *H01L 27/127* (2013.01); *G06F 2203/04103* (2013.01)

(56) References Cited

U.S. PATENT DOCUMENTS

| | | | |
|---|---|---|---|
| 2012/0242946 A1* | 9/2012 | Itoh | G02F 1/1339 349/153 |
| 2013/0334543 A1* | 12/2013 | Kim | G02F 1/13454 257/79 |
| 2014/0124800 A1 | 5/2014 | Um et al. | |
| 2016/0202553 A1* | 7/2016 | Jo | G02F 1/133536 349/96 |
| 2016/0266697 A1 | 9/2016 | Cheng et al. | |
| 2016/0291750 A1 | 10/2016 | Chai et al. | |
| 2017/0045984 A1 | 2/2017 | Lu et al. | |
| 2019/0155436 A1* | 5/2019 | Jin | G06F 3/0412 |

FOREIGN PATENT DOCUMENTS

| | | |
|---|---|---|
| CN | 104698709 A | 6/2015 |
| CN | 104716144 A | 6/2015 |

\* cited by examiner

ARRAY SUBSTRATE AND MANUFACTURING METHOD THEREOF, TOUCH DISPLAY PANEL, TOUCH DISPLAY APPARATUS

CROSS-REFERENCE TO RELATED APPLICATIONS

This application claims the priority to the Chinese Patent Application No. 201810027586.9, filed with Chinese Patent Office on Jan. 11, 2018, titled "ARRAY SUBSTRATE AND MANUFACTURING METHOD THEREOF, TOUCH DISPLAY PANEL, TOUCH DISPLAY APPARATUS", which is incorporated herein by reference in its entirety.

TECHNICAL FIELD

The present disclosure relates to the field of touch display technologies, and in particular, to an array substrate and a manufacturing method thereof, a touch display panel, and a touch display apparatus.

BACKGROUND

A touch display apparatus is an apparatus which can realize both display and touch. At present, the touch display apparatus includes a touch display panel, and the touch display panel includes a display panel and a touch panel. The touch display panel can be divided into a built-in touch display panel and an out-cell touch display panel (Out-cell) according to a relative location relation of the touch panel and the display panel. The built-in touch display panel is divided into an in-cell touch display panel (In-cell, also referred to as embedded touch display panel) and an on-cell touch display panel (On-cell). Since the in-cell touch display panel is convenient for manufacturing light and thin products, the in-cell touch display panel is studied and applied widely.

SUMMARY

In an aspect of the present disclosure, an array substrate is provided, and the array substrate includes thin film transistors, pixel electrodes, common electrodes and touch electrodes. The thin film transistors are disposed on a base substrate. The pixel electrodes are disposed on a side of the thin film transistors facing away from the base substrate, and each pixel electrode is coupled with a drain of a corresponding thin film transistor. The common electrodes are disposed on a side of the pixel electrodes facing away from the thin film transistors. The touch electrodes are disposed on a side of the common electrodes facing away from the pixel electrodes, and each touch electrode is coupled with a corresponding common electrode.

Optionally, the array substrate further includes at least one insulating planarization layer disposed between the thin film transistors and the pixel electrodes. The at least one insulating planarization layer has via holes therein which correspond to drains of the thin film transistors respectively, and each pixel electrode is coupled with a drain of a corresponding thin film transistor through a corresponding via hole.

Optionally, the at least one insulating planarization layer includes a single insulating planarization layer, and a thickness of the insulating planarization layer is greater than or equal to 6 µm. Alternatively, the at least one insulating planarization layer includes a plurality of insulating planarization layers, and a total thickness of the plurality of insulating planarization layers is greater than or equal to 6 µm.

Optionally, the at least one insulating planarization layer includes a single insulating planarization layer, and a thickness of the insulating planarization layer is substantially greater than or equal to 6 µm. Alternatively, the at least one insulating planarization layer includes a plurality of insulating planarization layers, and a total thickness of the plurality of insulating planarization layers is substantially greater than or equal to 6 µm.

Optionally, the at least one insulating planarization layer includes a single insulating planarization layer, and a surface of the insulating planarization layer facing away from the base substrate is substantially flat. Alternatively, the at least one insulating planarization layer includes a plurality of insulating planarization layers, and a surface, which is facing away from the base substrate, of a first insulating planarization layer closest to the thin film transistors among the plurality of insulating planarization layers is substantially flat.

Optionally, the at least one insulating planarization layer includes two insulating planarization layers. A thickness of one of the two insulating planarization layers close to the thin film transistors is greater than or equal to 4 µm, and a thickness of another one of the two insulating planarization layers away from the thin film transistors ranges from 2 µm to 4 µm.

Optionally, the at least one insulating planarization layer includes two insulating planarization layers. A thickness of one of the two insulating planarization layers close to the thin film transistors is substantially greater than or equal to 4 µm, and a thickness of another one of the two insulating planarization layers away from the thin film transistors substantially ranges from 2 µm to 4 µm.

Optionally, a material of the at least one insulating planarization layer is acrylic.

Optionally, the array substrate further includes a protective layer disposed on a side of the touch electrodes facing away from the base substrate.

Optionally, the array substrate further includes data lines disposed on the base substrate. A source of each thin film transistor is coupled with a corresponding data line, and an orthogonal projection of each touch electrode on the base substrate is at least partially overlapped with an orthogonal projection of a corresponding data line on the base substrate.

Optionally, except for a portion of each common electrode and a portion of a corresponding touch electrode that are coupled with each other, an orthogonal projection of the common electrode on the base substrate and an orthogonal projection of the touch electrode on the base substrate are non-overlapped.

Optionally, the thin film transistors are low temperature poly-silicon thin film transistors.

Optionally, the array substrate further includes a first dielectric layer disposed between the pixel electrodes and the common electrodes, and a second dielectric layer disposed between the common electrodes and the touch electrodes.

Optionally, a surface of the first dielectric layer facing away from the base substrate is substantially flat.

Optionally, materials of the first dielectric layer and the second dielectric layer are inorganic.

In another aspect of the present disclosure, a touch display panel is provided, and the touch display panel includes the array substrate in the above aspect.

In yet another aspect of the present disclosure, a touch display apparatus is provided, and the touch display apparatus includes the touch display panel described above.

In still another aspect of the present disclosure, a manufacturing method of the array substrate described in the above aspect is provided, and the method includes: providing a base substrate; forming thin film transistors on the base substrate; forming pixel electrodes, each pixel electrode being coupled with a drain of a corresponding thin film transistor; forming common electrodes; and forming touch electrodes, each touch electrode being coupled with a corresponding common electrode.

Optionally, the method further includes: forming at least one insulating planarization layer and via holes in the at least one insulating planarization layer. The at least one insulating planarization layer is located on the thin film transistors, and drains of the thin film transistors are exposed through the via holes formed in the at least one insulating planarization layer respectively. Each pixel electrode is coupled with a corresponding drain through a corresponding via hole formed in the at least one insulating planarization layer.

Optionally, the at least one the insulating planarization layer includes a plurality of insulating planarization layers, and forming at least one insulating planarization layer and via holes in the at least one insulating planarization layer, includes: depositing an insulating planarization layer; forming via holes in the insulating planarization layer to expose drains respectively; and repeating steps of depositing the insulating planarization layer and forming via holes in the insulating planarization layer a plurality of times. Via holes formed in a latter insulating planarization layer are communicated with via holes formed in a previous insulating planarization layer respectively.

Optionally, the manufacturing method of the array substrate further includes: after forming the pixel electrodes and before forming the common electrodes, forming a first dielectric layer; and after forming the common electrodes and before forming the touch electrodes, forming a second dielectric layer; and after forming the touch electrodes, forming a protective layer.

BRIEF DESCRIPTION OF THE DRAWINGS

The accompanying drawings are used for providing further understanding of embodiments of the present disclosure, and constitute a part of the present disclosure. The embodiments and description thereof in the present disclosure are used for explaining the present disclosure, but do not constitute a limitation to the present disclosure. In the accompanying drawings.

DETAILED DESCRIPTION

Figure 1:
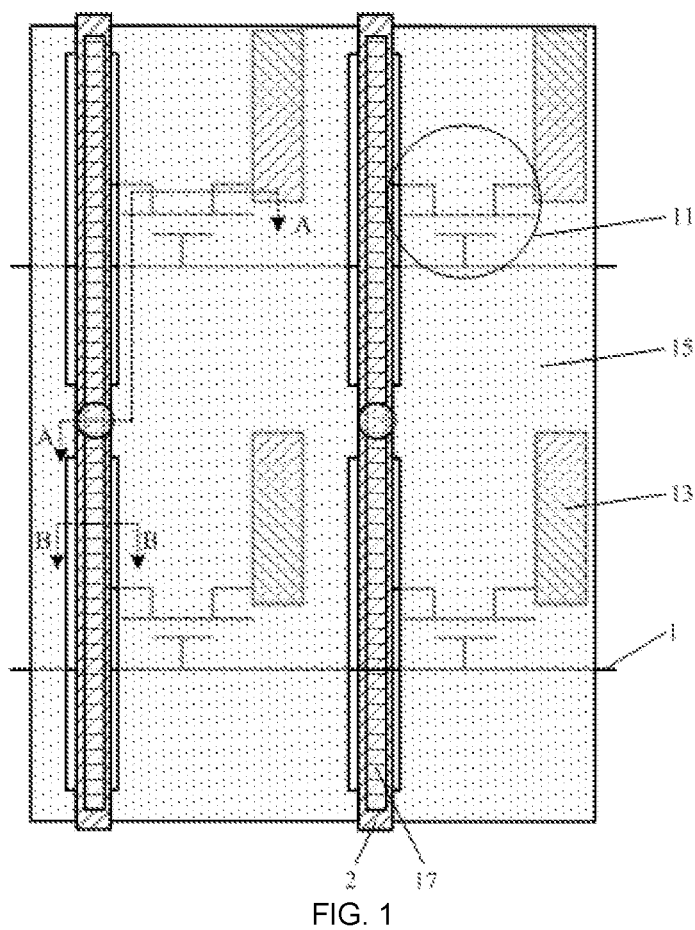
FIG. 1 is a plane view illustrating a structure of an array substrate in accordance with some embodiments of the present disclosure.

In order to further explain an array substrate and a manufacturing method thereof, a touch display panel, a touch display apparatus provided by some embodiments of the present disclosure, the following detailed description is made in conjunction with the accompanying drawings.

For convenience to understand the technical solutions in embodiments of the present disclosure, brief introductions to the technical terms in the description are provided.

The term "dielectric property" refers to a property of storing and dissipating electrostatic energy in a medium under actions of an electric field.

The term "aperture ratio" refers to a percentage of an active region, through which light can pass, in liquid crystal molecules, that is, a ratio of an area of an active light-transmitting region to an area of the total region in the liquid crystal molecules.

In the embodiments of the present disclosure, unless otherwise specified, the term "plurality" refers to two or more. The term "and/or" only describes relationships among associated objects, which include three relationships. For example, A and/or B, refers to three situations: only existing A, existing both A and B, and only existing B. Terms "First" and "second" are for distinguishing same or similar terms that have the basically same function and effect, and the person skilled in the art will understand that the terms "first" and "second" do not used to define the number and an execution order of the objects.

Some embodiments of the present disclosure provide an in-cell touch display panel (In-cell), and the in-cell touch display panel includes an array substrate. The array substrate includes a base substrate, thin film transistors, touch electrodes, common electrodes and pixel electrodes, and the thin film transistors, the touch electrodes, the common electrodes and the pixel electrodes are disposed in sequence on the base substrate. Each touch electrode is coupled with a corresponding common electrode, and a pixel electrode is coupled with a drain of a corresponding thin film transistor. The array substrate further includes an insulating planarization layer disposed between the thin film transistors and the touch electrodes.

During the operation of the touch display panel provided with the above-mentioned array substrate, in a display period, a thin film transistor is turned on, and a data line coupled with a source of the thin film transistor supplies a pixel voltage signal to a corresponding pixel electrode. In addition, the touch electrode (also referred to as a touch data line) supplies a common voltage signal to the common electrode, so that a voltage difference is produced between the pixel electrode and the common electrode, thereby realizing a display function of the touch display panel. In a touch period, the touch electrode transmits a touch voltage signal to the common electrode, and a voltage of the common electrode is changed after a touch, thereby realizing a touch function of the touch display panel. Furthermore, since the touch electrode transmits the voltage signal to the common electrode in time-division manner, that is, the common voltage signal in the display period and the touch voltage signal in the touch period are supplied alternately or discontinuously, so it may be realized that the touch electrode transmits the common voltage signal to the common electrode in the display period and transmits the touch voltage signal to the common electrode in the touch period.

Figure 2:
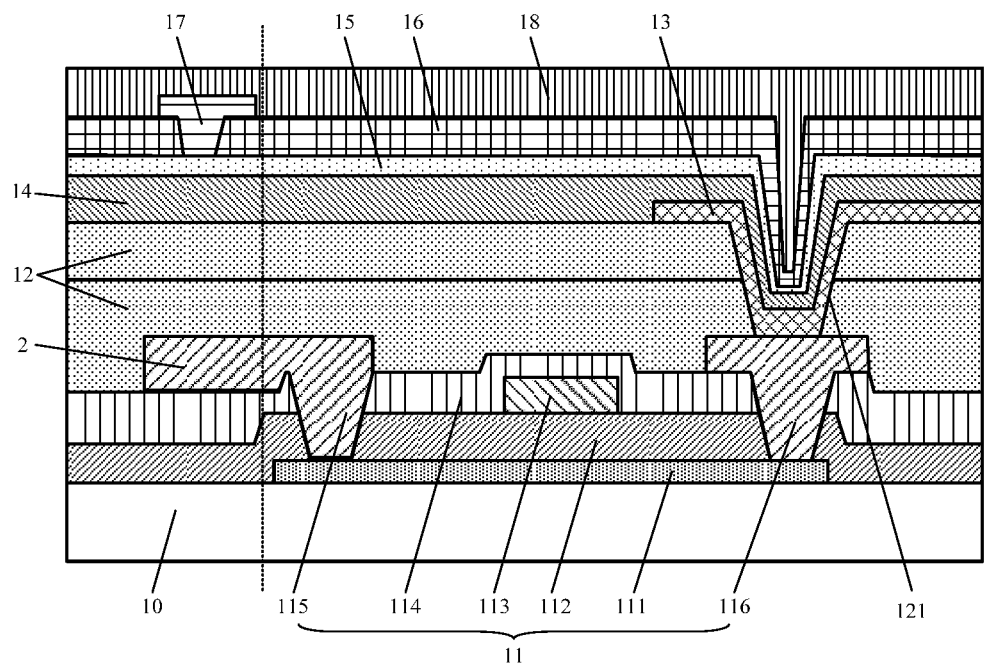
FIG. 2 is a section view of FIG. 1 along a line A-A.

Some embodiments of the present disclosure provide another array substrate. Referring to FIG. 1 and FIG. 2, the array substrate includes thin film transistors 11, pixel electrodes 13, common electrodes 15, and touch electrodes 17. Referring to FIG. 2, the thin film transistors 11 are disposed on the base substrate 10. The pixel electrodes 13 are disposed on a side of the thin film transistors 11 facing away from the base substrate 10, and each pixel electrode 13 is coupled with a drain 116 of a corresponding thin film transistor 11. The common electrodes 15 are disposed on a side of the pixel electrodes 13 facing away from the thin film transistors 11. The touch electrodes 17 are disposed on a side of the common electrodes 15 facing away from the pixel electrodes 13, and each touch electrode 17 is coupled with a corresponding common electrode 15.

For example, the array substrate is applied to a touch display panel to realize a display function and a touch function of the touch display panel. In some embodiments, referring continuously to FIG. 1 and FIG. 2, the array substrate further includes at least one insulating planarization layer 12 disposed between the thin film transistors 11 and the pixel electrodes 13. That is, the array substrate includes a base substrate 10, and thin film transistors 11, at least one insulating planarization layer 12, pixel electrodes 13, common electrodes 15 and the touch electrodes 17, which are disposed on the base substrate 10 in sequence. The at least one insulating planarization layer 12 has via holes 121 therein which correspond to drains 116 of the thin film transistors 11 respectively, and each pixel electrode 13 is coupled with a drain 116 of a corresponding thin film transistor 11 through a corresponding via hole 121.

The thin film transistors 11 are arranged in an array on the base substrate 10. The at least one insulating planarization layer 12 is disposed on a side of the thin film transistors 11 facing away from the base substrate 10, and covers the thin film transistors 11.

The pixel electrodes 13 are disposed on a side of the at least one insulating planarization layer 12 facing away from the thin film transistors 11. The pixel electrodes 13 are arranged in an array, and each pixel electrode 13 is coupled with a drain 116 of a corresponding thin film transistor 11 through a corresponding via hole 121 formed in the at least one insulating planarization layer 12. In some embodiments, a material of the pixel electrodes 13 is selected from transparent conductive materials such as ITO (Indium Tin Oxide), IGZO (Indium Gallium Zinc Oxide), etc.

The common electrodes 15 are disposed on a side of the pixel electrodes 13 facing away from the at least one insulating planarization layer 12, and an orthographic projection of each pixel electrode 13 on the base substrate 10 is within a range of an orthographic projection of a corresponding common electrode 15 on the base substrate 10. In some embodiments, a material of the common electrodes 15 is selected from transparent conductive materials such as ITO (Indium Tin Oxide), IGZO (Indium Gallium Zinc Oxide), etc.

The touch electrodes 17 are disposed on a side of the common electrodes 15 facing away from the pixel electrodes 13, that is, each touch electrode 17 is disposed on a corresponding common electrode 15. Each touch electrode 17 is coupled with a corresponding common electrode 15.

In a case where the array substrate provided by the embodiments of the present disclosure is applied to the touch display panel, during the operation of the touch display panel, in a display period, a thin film transistor 11 is turned on and transmits a pixel voltage signal to a corresponding pixel electrode 13. In addition, a touch electrode 17 transmits a common voltage signal to a corresponding common electrode 15, so that a voltage difference is produced between the pixel electrode 13 and the common electrode 15, thereby realizing a display function of the touch display panel. In a touch period, the touch electrode 17 transmits a touch voltage signal to the corresponding common electrode 15, and the voltage signal of common electrode 15 is changed after a press, thereby realizing a touch function of the touch display panel. As mentioned above, since the touch electrode transmits different voltage signals to the common electrode in time-division manner, that is, it transmits the common voltage signal in the display period and the touch voltage signal in the touch period alternately or discontinuously, so the touch electrode transmits the common voltage signal to the common electrode in the display period and transmits the touch voltage signal to the common electrode in the touch period.

In the array substrate provided by the embodiments of the present disclosure, the pixel electrodes 13 are disposed on a side of the thin film transistors 11 facing away from the base substrate, the common electrodes 15 are disposed on the side of the pixel electrode 13 facing away from the thin film transistors 11, and the touch electrodes are disposed on a side of the common electrodes 15 facing away from the pixel electrode 13. Thus, compared with a structure in which the touch electrodes are disposed on a side of the thin film transistors facing away from the base substrate, the common electrodes are disposed on a side of the thin film transistors facing away from the touch electrodes and the pixel electrodes are disposed on a side of the common electrodes facing away from the thin film transistors, the locations of the common electrodes and the pixel electrodes are exchanged in the embodiments of the present disclosure and the positions of the touch electrodes are changed. That is, the pixel electrodes 13 are disposed between the common electrodes 15 and the thin film transistors 11. Thus, a distance between a pixel electrode 13 and a corresponding thin film transistor 11 becomes smaller, thereby increasing a storage capacitance between the pixel electrode 13 and the thin film transistor 11.

Moreover, the pixel electrodes 13 are disposed between the thin film transistors 11 and the common electrodes 15, and thus after the array substrate provided by the embodiments of the present disclosure is applied to a touch display panel, during the operation of the touch display panel, the pixel electrodes 13 may cut off electric power lines, i.e., imaginary electric field lines of the electric field between the common electrode 15 and sources of the thin film transistor 11, thereby playing a role of shielding. Furthermore, a capacitor formed by the common electrode 15 and the electrode, i.e., the source 115, of the thin film transistor 11 is divided to two capacitors connected in series, thereby decreasing the parasitic capacitance between the common electrode 15 and the source 115 of the thin film transistor 11.

In a case where the array substrate further includes the at least one insulating planarization layer 12 disposed between the common electrodes 15 and the thin film transistors 11, the at least one insulating planarization layer 12 may enlarge the distance between the common electrode 15 and the thin film transistor 11, such as a distance between the common electrode 15 and the source 115 of the thin film transistor 11, thereby further decreasing the parasitic capacitance between the common electrode 15 and the source 115 of the thin film transistor 11.

Therefore, in the case where the array substrate provided by the embodiments of the present disclosure is applied to the touch display panel, during the operation of the touch display panel, the capacitance, i.e., coupling capacitance between the common electrode 15 and the electrode, such as the source 115, of the thin film transistor 11 is decreased in the display period of the touch display panel, so that the voltage of the common electrode 15 that needs to be supplied decreases when the touch display panel displays, and thereby reducing a power dissipation of the touch display panel when working.

In some embodiments, a material of the touch electrodes is metal, and the touch electrodes are formed through a sputtering process under a high temperature. In some cases, when the touch electrodes are formed on the at least one insulating planarization layer through the sputtering process, as the material of the at least one insulating planarization layer is organic material, the at least one insulating planarization layer is prone to decompose in the sputtering chamber with a relatively high temperature, which results in pollution of the sputtering chamber. In the array substrate provided by the embodiments of the present disclosure, the pixel electrodes 13 are formed on the at least one insulating planarization layer 12, and the touch electrodes 17 are not formed on the insulating planarization layer 12. In this way, when the touch electrodes 17 are formed through the sputtering process, the at least one insulating planarization layer 12 is not decomposable under the higher temperature, and thereby the sputtering chamber is prevented from being polluted when the touch electrodes are formed through the sputtering process.

In the related art, when the material of the at least one insulating planarization layer 12 on the thin film transistors 11 is organic material, in order to prevent the organic material from being decomposed when the touch electrodes 17 are formed on the at least one insulating planarization layer 12 through the sputtering process, the array substrate further includes an inorganic material protective layer which is formed after the insulating planarization layer 12 are formed and after the via holes 121 are formed in portions of the insulating planarization layer 12 corresponding to the drains 116 respectively, via holes are also formed in portions of the inorganic material protective layer corresponding to the drains 116, and the diameter of the via hole formed in the inorganic material protective layer is smaller than the diameter of the via hole formed in the insulating planarization layer 12. Therefore, another mask needs to be used to form the via holes formed in the inorganic material protective layer, which results in the complicated manufacturing process and high costs of the array substrate tedious. However, in the embodiments of the present disclosure, the touch electrodes 17 are not formed on the insulating planarization layer 12, so there is no need to equip with another mask mentioned above, so that the process steps for manufacturing the array substrate are simplified, and the cost for manufacturing the array substrate is reduced.

Furthermore, in some embodiments, there is no other conducting film layer provided between the pixel electrodes 13 and the common electrodes 15. Therefore, in the case where the array substrate provided by the embodiments of the present disclosure is applied to the touch display panel, during the operation of the touch display panel, in the display period, a storage capacitance between the pixel electrode 13 and the common electrode 15 may be more stable, and thus the display effect of the touch display panel may be improved.

In the case where the array substrate provided by the above-mentioned embodiments is applied to the touch display panel, during the operation of the touch display panel, in the display period, the thin film transistor 11 is turned on, and transmits a pixel voltage signal to a corresponding pixel electrode 13. At this time, the touch electrode 17 transmits a common voltage signal to a corresponding common electrode 15, so that the voltage difference between the pixel electrode 13 and the common electrode 15 is generated, thereby realizing the display function of the touch display panel. In the touch period, the touch electrode 17 transmits a touch voltage signal to the corresponding common electrode 15, thereby realizing the touch function of the touch display panel. Therefore, in the display period, the common electrode 15 and the pixel electrode 13 both realize the display function of the touch display panel, and in the touch period, as a portion of a touch sensing element, the common electrode 15 realizes the touch function of the touch display panel. In addition, the common electrodes 15 are corresponding to the touch electrodes respectively, so that in the touch period, a response signal, which is generated in response to the change of the touch voltage applied to one or more common electrodes, is feedback to a touch drive chip. An area of each common electrode 15 is set based on actual requirements. For example, the area of the common electrode 15 is set according to a required touch resolution and the number of the touch electrodes 17 driven by the touch drive chip.

In some embodiments, the number and the total thickness of the at least one insulating planarization layer 12 are set based on actual requirements. For example, the at least one insulating planarization layer 12 includes a single insulating planarization layer 12, and a thickness of the insulating planarization layer 12 is set to greater than or equal to 6 μm, for example, 6 μm, 7 μm, 8 μm and so on. In other examples, the at least one insulating planarization layer 12 includes a single insulating planarization layer 12, and a thickness of the insulating planarization layer 12 is set to substantially greater than or equal to 6 μm. Thus, the distance between the common electrode 15 and the thin film transistor 11 may be larger, and thereby the capacitance between the common electrode 15 and the electrode, such as the source 115 of the thin film transistor 11, decreases in the display period of the touch display panel when the touch display panel works. Therefore, the voltage of the common electrode 15 applied by the touch display panel when displaying decreases, and thereby the power dissipation of the touch display panel when working may be reduced.

In some other embodiments, the at least one insulating planarization layer 12 includes a plurality of insulating planarization layers 12, such as two, three or more insulating planarization layers 12. The plurality of insulating planarization layers 12 are stacked on top of each other and cover the thin film transistors 11. Here, a total thickness of the plurality of insulating planarization layers 12 is set as greater than or equal to 6 μm. In other examples, a total thickness of the plurality of insulating planarization layers 12 is set as substantially greater than or equal to 6 μm. Thus, when the total thickness of the insulating planarization layers 12 is constant, compared with one layer of insulating planarization layer 12, the thickness of each of the plurality of insulating planarization layers 12 is smaller, e.g., a thickness of each insulating planarization layer is substantially 2 to 3 μm, which is appropriate for forming a layer of insulating planarization layer, and thereby the insulating planarization layers are formed easily. Therefore, it may reduce a process difficulty for forming the insulating planarization layers 12, and be convenient to form the via holes in the insulating planarization layers 12.

In some embodiments, the at least one insulating planarization layer 12 includes a plurality of insulating planarization layers 12, and via holes are formed respectively in portions of each insulating planarization layer 12 corresponding to drains 116 of the thin film transistors 11. The drains 116 of the thin film transistors 11 are exposed through the via holes respectively, and the via holes formed in the insulating planarization layers 12 at a same position are communicated with each other.

Since the at least one insulating planarization layer 12 is provided between the thin film transistors 11 and the pixel electrodes 13, and the total thickness of the at least one insulating planarization layer 12 is greater than or equal to 6 µm, compared with the situation in which one inorganic material layer is provided between the thin film transistors 11 and the pixel electrodes 13 to achieve insulation, the at least one insulating planarization layer 12 may increase the reliability of insulation between the thin film transistors 11 and the pixel electrodes 13, and also may increase the distance between the common electrodes 15 and the thin film transistors 11.

Although the number of the at least one insulating planarization layer 12 is at least one, in practical application, the number of the at least one insulating planarization layer 12 depends on actual product requirements, and process capability (such as a maximum thickness of the film layer achieved through the manufacturing process), etc. For example, the distance between the pixel electrode 13 and a corresponding thin film transistor 11 in the array substrate, i.e., the total thickness of the at least one insulating planarization layer 12, is calculated according to actual product requirements, and the total thickness is greater than or equal to 6 µm. Then, the number of the at least one insulating planarization layer 12 is calculated according to the total thickness, the manufacturing process of the at least one insulating planarization layer 12, and the process capability of manufacturing the insulating planarization layer 12, etc.

In some embodiments, referring continuously to FIG. 2, the at least one insulating planarization layer 12 includes two insulating planarization layers 12. Compared with one insulating planarization layer 12, the two insulating planarization layers 12 may increase the total thickness to some extent in the case of meeting a demand of the total thickness of the insulating planarization layers 12, so as to increase the distance between the thin film transistor 11 and the pixel electrode 13, and to increase the distance between the thin film transistor 11 and the common electrode 15. Therefore, the capacitance between the common electrode 15 and the electrode, such as the source 115, of the thin film transistor 11 is decreased when the touch display panel works, and thereby decreasing the power dissipation when the touch display panel works. Meanwhile, compared with three or more insulating planarization layers 12, the two insulating planarization layers 12 may decrease the manufacturing process steps of the array substrate in the case of meeting the demand of the total thickness of the insulating planarization layers 12.

In some embodiments, the at least one insulating planarization layer 12 includes two insulating planarization layers 12, a thickness of one of which close to the thin film transistors 11 is greater than or equal to 4 µm, and a thickness of another one of which away from the thin film transistors 11 ranges from 2 µm to 4 µm. In some other examples, a thickness of one of which close to the thin film transistors 11 is substantially greater than or equal to 4 µm, and a thickness of another one of which away from the thin film transistors 11 substantially ranges from 2 µm to 4 µm. That is, after the formation of the thin film transistors 11, a thickness of a first insulating planarization layer 12 formed earlier is greater than or equal to 4 µm, and a thickness of a second insulating planarization layer 12 formed later ranges from 2 µm to 4 µm. Thus, a planarization effect of a structure formed on the base substrate 10 by the first insulating planarization layer 12 is strengthen, which is convenient for the formation of the second insulating planarization layer 12 later. In addition, since the main function of the first insulating planarization layer 12 is planarization, and the drain 116 of the thin film transistor 11 is a projection on the base substrate 10, the thickness of the portion of the first insulating planarization layer 12 corresponding to the drain 116 of the thin film transistor 11 is smaller (usually smaller than the actual setting thickness of the insulating planarization layer 12). Therefore, in the case of ensuring the planarization, the difficulty for the formation of the via hole in the first insulating planarization layer 12 will not increase.

In addition, in some embodiments, the at least one insulating planarization layer 12 includes two insulating planarization layers 12, and a thickness of one of the two insulating planarization layers 12 away from the thin film transistor 11 ranges from 2 µm to 4 µm. That is, after the formations of the thin film transistors 11 and the first insulating planarization layer 12, the thickness of the second insulating planarization layer 12 formed later is in the range of 2 µm~4 µm. After the first insulating planarization layer 12 is formed, a surface of the first insulating planarization layer facing away from the base substrate 10 is substantially flat. That is, an upper surface of the first insulating planarization layer in FIG. 2 is substantially flat, so that the thickness of the second insulating planarization layer formed later is substantially flat in all regions. The thickness of the second insulating planarization layer ranges from 2 µm to 4 µm, and thus under a premise that the total thickness of the two the insulating planarization layer 12 meets demand, the thickness of the second insulating planarization layer is prevented from being larger, so as to decrease difficulties for forming the via holes in the two insulating planarization layers 12.

In some embodiments, the at least one insulating planarization layer 12 includes a plurality of insulating planarization layers 12, and the plurality of insulating planarization layers 12 and the via holes passing through each insulating planarization layer 12 are formed at least in the following two manners. For example, in one manner, the plurality of insulating planarization layers 12 are formed sequentially, and then via holes each penetrating through the plurality of insulating planarization layers 12 are formed by a single patterning process. The drains 116 of the thin film transistors 11 are exposed through the via holes formed in the plurality of insulating planarization layers 12 respectively. In some other examples, in another manner, one insulating planarization layer 12 is formed, and then via holes each penetrating through this insulating planarization layer 12 are formed therein by a single patterning process to expose drains 116 of the thin film transistors 11 respectively. Each via hole is communicated with a corresponding via hole formed in a previous insulating planarization layer 12. For example, the at least one insulating planarization layer 12 includes two insulating planarization layers 12 which are formed in the second manner, the method for forming the two insulating planarization layers 12 includes: forming a first insulating planarization layer 12 covering the thin film transistors 11 and the base substrate 10; forming via holes in portions of the first insulating planarization layer 12 respectively corresponding to the drains 116 of the thin film transistors 11 to expose the drains 116 of the thin film transistors 11 respectively; forming a second insulating planarization layer 12 covering the first insulating planarization layer 12 on the first insulating planarization layer 12; and forming via holes in portions of the second insulating planarization layer 12 corresponding to the drains 116 of the thin film transistors 11 respectively. Thus, the via holes formed in the second insulating planarization layer 12 are corresponding to and communicated with the via holes formed in the first insulating planarization layer 12 respectively, so that the drains 116 of the thin film transistors 11 are exposed through the via holes formed in the second insulating planarization layer 12 respectively.

In some embodiments, the material of the at least one insulating planarization layer 12 is selected according to the actual requirements. For example, the material of the insulating planarization layer is organic material, such as acrylic, etc. In this way, compared with the insulating planarization layer 12 formed by inorganic material, the thickness of the at least one insulating planarization layer 12 may be increased. In addition, during the process of forming the via holes, exposure and development processes are required, and etching and de-glue processes are unnecessary, thereby reducing manufacturing process of the array substrate.

Figure 3:
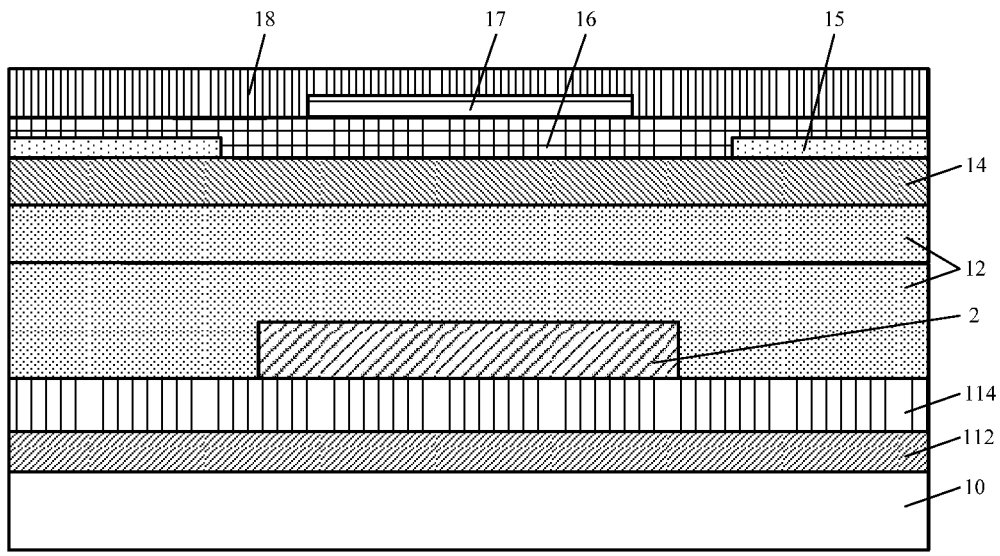
FIG. 3 is a section view of FIG. 1 along a line B-B.

Go on referring to FIG. 2 and FIG. 3, in some embodiments, the array substrate further includes a protective layer 18 disposed on a side of the touch electrodes 17 facing away from the base substrate 10, and the protective layer 18 covers the touch electrodes 17. In some examples, the material of the protective layer 18 is organic material, such as acrylic material, or inorganic material such as $SiN_x$. The protective layer 18 may protect and prevent the metallic touch electrodes 17 from being oxidized, and the protective layer 18 may also play a role of planarization, so as to form a function layer such as an alignment layer.

Referring to FIG. 1, FIG. 2 and FIG. 3, in some embodiments, the array substrate further includes data lines 2 disposed on the base substrate 10. A source 115 of each thin film transistor 11 is coupled with a corresponding data line 2. An orthogonal projection of each touch electrode 17 on the base substrate 10 is at least partially overlapped with an orthogonal projection of a corresponding data line 2 on the base substrate 10. That is, for example, the orthogonal projection of the touch electrode 17 on the base substrate 10 is completely coincided with the orthogonal projection of the data line 2 on the base substrate 10. In some other examples, the orthogonal projection of the touch electrode 17 on the base substrate 10 is within a range of the orthogonal projection of the data line 2 on the base substrate 10. In some other examples, the orthogonal projection of the data line 2 on the base substrate 10 is within a range of the orthogonal projection of the touch electrode 17 on the base substrate 10, and the orthogonal projection of the touch electrode 17 on the base substrate 10 is slightly larger than the orthogonal projection of the data line 2 on the base substrate 10 along a direction perpendicular to a length of the data line 2. It can be seen from the above that the touch electrode 17 is formed right above the data line 2, so the touch electrode 17 does not cover the pixel display region, thereby not causing harmful effects on the aperture ratio of the touch display panel.

Go on referring to FIG. 1 and FIG. 3, in some embodiments, except for a portion of each common electrode 15 and a proton of a corresponding touch electrode 17 coupled to each other, an orthogonal projection of the common electrode 15 on the base substrate 10 and an orthogonal projection of the touch electrode 17 on the base substrate 10 are non-overlapped. Consequently, it may reduce the corresponding area between the common electrode 15 and the data line 2, and thereby reducing the capacitance (i.e., coupling capacitance) between the common electrode 15 and the data line 2 when the touch display panel displays, so as to decrease the power dissipation when the touch display panel works.

In some embodiments, a type of the thin film transistor 11 is set according to actual requirements. For example, the type of the thin film transistor 11 is selected according to the material of an active layer 111. For example, the thin film transistors 11 are amorphous thin film transistors, monocrystalline silicon thin film transistors, polycrystalline silicon thin film transistors, or metallic oxide thin film transistors, etc.; or/and, the thin film transistor 11 is selected according to a structure of the active layer 111. For example, the thin film transistors 11 are top-gate type thin film transistors, or base-gate type thin film transistors. In some embodiments, the material of the active layer 111 in the thin film transistor 11 is selected as a low temperature poly-silicon, and the active layer 111 in the thin film transistor 11 is of the top-gate type, that is, the thin film transistors 11 are, for example, top-gate type low temperature poly-silicon thin film transistors.

Referring to FIGS. 1 and 2, in some embodiments, each thin film transistor 11 includes an active layer 111, a gate insulating layer 112, a gate 113, an interlamination insulating layer 114, a source 115 and a drain 116. The active layer 111 is disposed on the base substrate 10, and a material of the active layer 111 is the low temperature poly-silicon. The gate insulating layer 112 is disposed on a side of the active layer 111 facing away from the base substrate 10. The gate 113 is disposed on a side of the gate insulating layer 112 facing away from the active layer 111. The gate lines 1 are provided in a same layer as the gate 113, and each gate line 1 is coupled with corresponding gates 113. The interlamination insulating layer 114 is disposed on a side of the gate 113 and the gate lines 1 facing away from the gate insulating layer 112. The source 115 and the drain 116 are disposed on a side of the interlamination insulating layer 114 facing away from the gate 113, and an orthogonal projection of the source 115 on the base substrate 10 and an orthogonal projection of the drain 116 on the base substrate 10 are spaced from each other along a direction parallel to the gate line 1. The source 115 and the drain 116 are coupled with the active layer 111 by passing through via holes formed in the interlamination insulating layer 114 and the gate insulating layer 112. The data lines 2 are provided in a same layer as the source 115 and the drain 116, and each data line 2 is coupled with corresponding sources 115. In addition, the data lines 2 are intercrossed perpendicularly with the gate lines 1, thereby defining pixel regions.

Go on referring to FIG. 2 and FIG. 3, in some embodiments, the array substrate further includes a first dielectric layer 14 disposed between the pixel electrodes 13 and the common electrodes 15, so as to provide the insulation between the pixel electrodes 13 and the common electrodes 15. In some embodiments, the material of the first dielectric layer 14 is inorganic material or organic material. For example, the material of the first dielectric layer 14 is inorganic material with a good dielectric property, so as to enlarge a storage capacitance between the pixel electrode 13 and a corresponding common electrode 15, which improves the display function of the display panel.

Go on referring to FIG. 2 and FIG. 3, in some embodiments, the array substrate further includes a second dielectric layer 16 disposed between the common electrodes 15 and the touch electrodes 17, so as to provide the insulation between the common electrodes 15 and the touch electrodes 17 except a portion of the common electrode 15 and a portion of the touch electrodes 17 coupled to each other. The material of the second dielectric layer 16 is inorganic material such as $SiO_x$, $SiN_x$, or SiNO, so as to prevent the second dielectric layer 16 from being decomposed when the metallic touch electrodes 17 are formed through the sputtering process, thereby preventing the pollution of sputtering chamber when the metallic touch electrodes 17 are formed through the sputtering process.

In some embodiments, the organic material is selected according to the actual requirements. For example, the organic material is acrylic, polyimide, etc. The Inorganic material is selected according to the actual requirements. For example, the inorganic material is $SiO_x$, $SiN_x$, or SiNO, etc.

Some embodiments of the present disclosure provide a touch display panel, and the touch display panel includes the array substrate provided by the embodiments above-mentioned.

The touch display panel and the array substrate above-mentioned have same advantages, which are not described herein again.

Some embodiments of the present disclosure provide a touch display apparatus, and the touch display apparatus includes the touch display panel provided by the embodiments above-mentioned.

The touch display apparatus and the touch display panel above-mentioned have same advantages, which are not described herein again.

Figure 4:
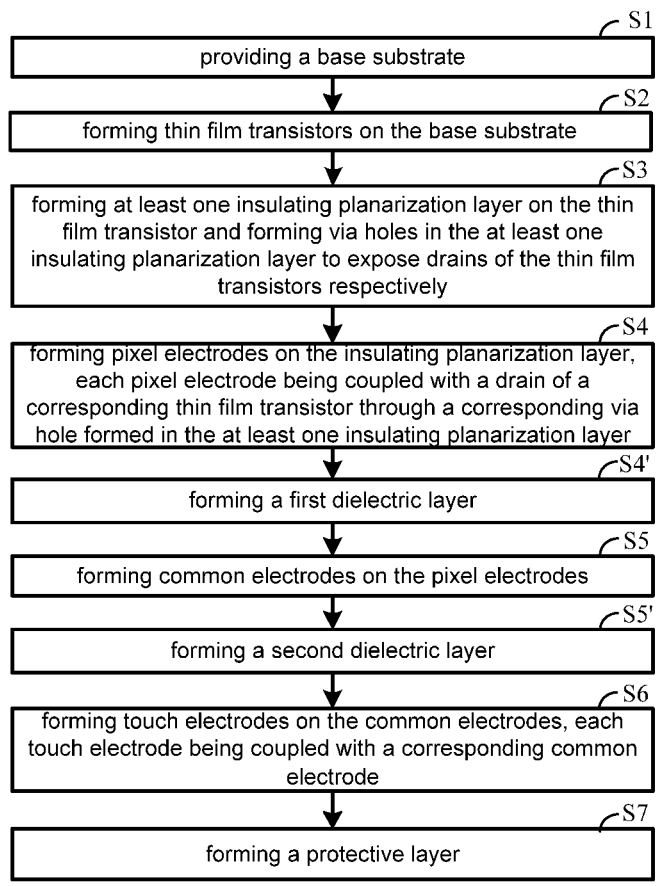
FIG. 4 is a flowchart of a manufacturing method of an array substrate in accordance with some embodiments of the present disclosure.

Referring to FIG. 4, some embodiments of the present disclosure provide a manufacturing method of an array substrate. The array substrate is for example the array substrate above-mentioned, and the manufacturing method includes steps 1 to 7 (S1-S7):

S1, providing a base substrate;

S2, forming thin film transistors on the base substrate;

S3, forming at least one insulating planarization layer on the thin film transistor and forming via holes in the at least one insulating planarization layer to expose drains of the thin film transistors respectively;

S4, forming pixel electrodes on the insulating planarization layer, each pixel electrode being coupled with a drain of a corresponding thin film transistor through a corresponding via hole formed in the at least one insulating planarization layer;

S5, forming common electrodes on the pixel electrodes; and

S6, forming touch electrodes on the common electrodes, each touch electrode being coupled with a corresponding common electrode.

The manufacturing method of the array substrate and the array substrate above-mentioned have the same advantages, which are not described herein again.

Figure 5:
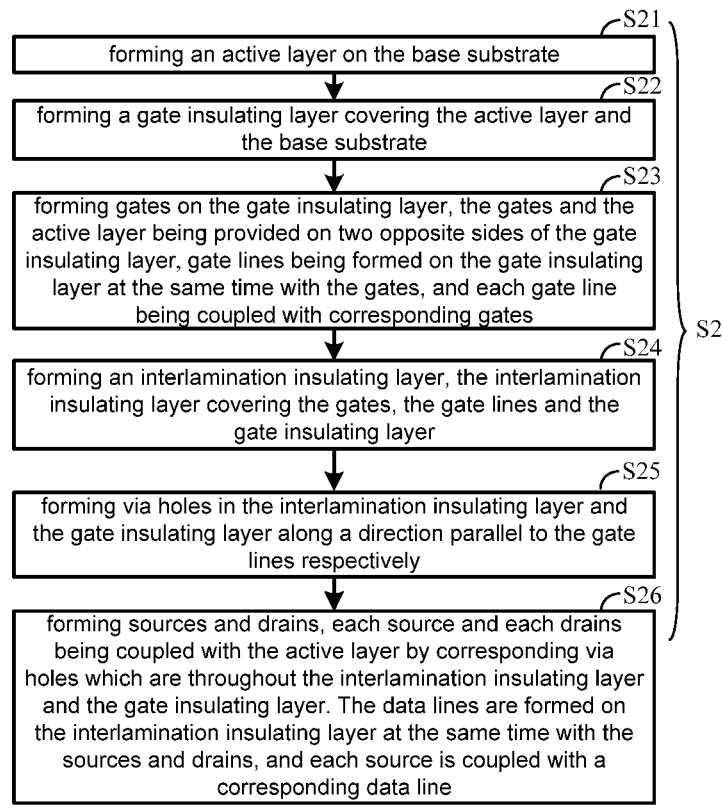
FIG. 5 is a flowchart of S2 in FIG. 4.

Referring to FIG. 5, S2, i.e., forming thin film transistors on the base substrate includes:

S21, forming an active layer on the base substrate;

S22, forming a gate insulating layer covering the active layer and the base substrate;

S23, forming gates on the gate insulating layer, the gates and the active layer being provided on two opposite sides of the gate insulating layer, gate lines being formed on the gate insulating layer at the same time with the gates, and each gate line being coupled with corresponding gates;

S24, forming an interlamination insulating layer, the interlamination insulating layer covering the gates, the gate lines and the gate insulating layer;

S25, forming via holes in the interlamination insulating layer and the gate insulating layer along a direction parallel to the gate lines respectively; and S26, forming sources and drains, each source and each drains being coupled with the active layer by corresponding via holes which are throughout the interlamination insulating layer and the gate insulating layer. The data lines are formed on the interlamination insulating layer at the same time with the sources and drains, and each source is coupled with a corresponding data line.

Figure 6:
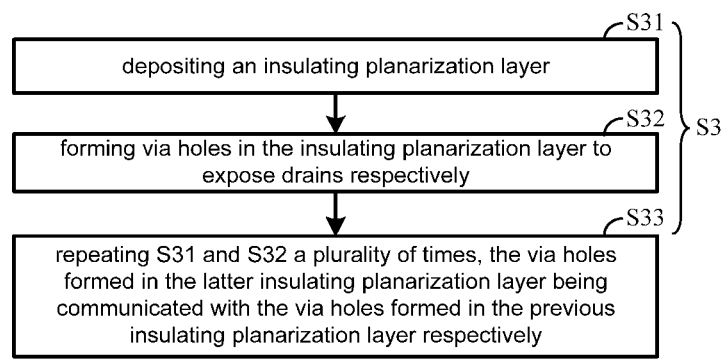
FIG. 6 is a flowchart of S3 in FIG. 4.

In some embodiments, referring to FIG. 6, the at least one insulating planarization layer includes a plurality of insulating planarization layers and S3, i.e., forming at least one insulating planarization layer and via holes in the at least one insulating planarization layer, includes:

S31, depositing an insulating planarization layer;

S32, forming via holes in the insulating planarization layer to expose drains respectively;

S33, repeating S31 and S32 a plurality of times, the via holes formed in the latter insulating planarization layer being communicated with the via holes formed in the previous insulating planarization layer respectively.

In some embodiments, go on referring to FIG. 4, the manufacturing method of the array substrate further includes:

S4', which is after S3 and before S5, forming a first dielectric layer;

S5', which is after S5 and before S6, forming a second dielectric layer; and

S7 after S6, forming a protective layer.

In the foregoing descriptions of implementation manners, specific features, structures, materials or characteristics can be combined by an appropriate way in any one or plural embodiments or examples.

The foregoing descriptions are merely some implementation manners of the present disclosure, but the protection scope of the present disclosure is not limited thereto, and the changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. An array substrate, comprising:
   thin film transistors disposed on a base substrate;
   pixel electrodes disposed on a side of the thin film transistors facing away from the base substrate, each pixel electrode being coupled with a drain of a corresponding thin film transistor;
   common electrodes disposed on a side of the pixel electrodes facing away from the thin film transistors;
   touch electrodes disposed on a side of the common electrodes facing away from the pixel electrodes, each touch electrode being coupled with a corresponding common electrode;
   at least one insulating planarization layer disposed between the thin film transistors and the pixel electrodes, wherein the at least one insulating planarization layer has via holes therein which correspond to drains of the thin film transistors respectively, and each pixel electrode is coupled with a drain of a corresponding thin film transistor through a corresponding via hole;
   a first dielectric layer disposed between the pixel electrodes and the common electrodes; and
   a second dielectric layer disposed between the common electrodes and the touch electrodes.

2. The array substrate according to claim 1, wherein
   the at least one insulating planarization layer comprises a single insulating planarization layer, and a thickness of the insulating planarization layer is greater than or equal to 6 µm; or
   the at least one insulating planarization layer comprises a plurality of insulating planarization layers, and a total thickness of the plurality of insulating planarization layers is greater than or equal to 6 μm; or the at least one insulating planarization layer comprises a single insulating planarization layer, and a thickness of the insulating planarization layer is substantially greater than or equal to 6 μm; or the at least one insulating planarization layer comprises a plurality of insulating planarization layers, and a total thickness of the plurality of insulating planarization layers is substantially greater than or equal to 6 μm.

3. The array substrate according to claim 1, wherein the at least one insulating planarization layer comprises a single insulating planarization layer, and a surface of the insulating planarization layer facing away from the base substrate is substantially flat; or the at least one insulating planarization layer comprises a plurality of insulating planarization layers, and a surface, which is facing away from the base substrate, of a first insulating planarization layer closest to the thin film transistors among the plurality of insulating planarization layers is substantially flat.

4. The array substrate according to claim 1, wherein, the at least one insulating planarization layer comprises two insulating planarization layers, a thickness of one of the two insulating planarization layers close to the thin film transistors is greater than or equal to 4 μm, and a thickness of another one of the two insulating planarization layers away from the thin film transistors ranges from 2 μm to 4 μm; or the at least one insulating planarization layer comprises two insulating planarization layers, a thickness of one of the two insulating planarization layers close to the thin film transistors is substantially greater than or equal to 4 μm, and a thickness of another one of the two insulating planarization layers away from the thin film transistors substantially ranges from 2 μm to 4 μm.

5. The array substrate according to claim 1, wherein, a material of the at least one insulating planarization layer is acrylic.

6. The array substrate according to claim 1, further comprising a protective layer disposed on a side of the touch electrodes facing away from the base substrate.

7. The array substrate according to claim 1, further comprising data lines disposed on the base substrate, wherein a source of each thin film transistor is coupled with a corresponding data line, and an orthogonal projection of each touch electrode on the base substrate is at least partially overlapped with an orthogonal projection of a corresponding data line on the base substrate.

8. The array substrate according to claim 7, wherein, except for a portion of each common electrode and a portion of a corresponding touch electrode that are coupled with each other, an orthogonal projection of the common electrode on the base substrate and an orthogonal projection of the touch electrode on the base substrate are non-overlapped.

9. The array substrate according to claim 1, wherein, the thin film transistors are low temperature poly-silicon thin film transistors.

10. The array substrate according to claim 1, wherein, a surface of the first dielectric layer facing away from the base substrate is substantially flat.

11. The array substrate according to claim 1, wherein, materials of the first dielectric layer and the second dielectric layer are inorganic.

12. A touch display panel, comprising the array substrate according to claim 1.

13. A touch display apparatus, comprising the touch display panel according to claim 12.

14. A manufacturing method of the array substrate according to claim 1, comprising:

providing a base substrate;

forming thin film transistors on the base substrate;

forming at least one insulating planarization layer and via holes in the at least one insulating planarization layer, wherein, the at least one insulating planarization layer is located on the thin film transistors, drains of the thin film transistors are exposed through the via holes formed in the at least one insulating planarization layer respectively;

forming pixel electrodes, each pixel electrodes being coupled with a drain of a corresponding thin film transistor through a corresponding via hole formed in the at least one insulating planarization layer;

forming a first dielectric layer;

forming common electrodes;

forming a second dielectric layer; and forming touch electrodes, each touch electrode being coupled with a corresponding common electrode.

15. The manufacturing method of the array substrate according to claim 14, wherein the at least one the insulating planarization layer includes a plurality of insulating planarization layers, and forming at least one insulating planarization layer and via holes in the at least one insulating planarization layer, comprises:

depositing an insulating planarization layer;

forming via holes in the insulating planarization layer to expose drains respectively; and repeating steps of depositing the insulating planarization layer and forming the via holes in the insulating planarization layer a plurality of times, wherein via holes formed in a latter insulating planarization layer are communicated with via holes formed in a previous insulating planarization layer respectively.

16. The manufacturing method of the array substrate according to claim 14, further comprising:

after forming the pixel electrodes, and before forming the common electrodes:

forming a first dielectric layer; and after forming the common electrodes, and before forming the touch electrodes:

forming a second dielectric layer; and after forming the touch electrodes:

forming a protective layer.

* * * * *